(12) United States Patent
Kim et al.

(10) Patent No.: US 11,197,377 B2
(45) Date of Patent: Dec. 7, 2021

(54) FLEXIBLE CIRCUIT BOARD AND METHOD FOR PRODUCING SAME

(71) Applicant: STEMCO CO., LTD., Cheongju-si (KR)

(72) Inventors: Hong Man Kim, Cheongju-si (KR); Kang Dong Kim, Seongnam-si (KR); Won Tae Jo, Cheongju-si (KR); Duck Jae Seo, Cheongju-si (KR); Jung Sub Kim, Cheongju-si (KR)

(73) Assignee: STEMCO CO., LTD., Cheongju-si (KR)

( * ) Notice: Subject to any disclaimer, the term of this patent is extended or adjusted under 35 U.S.C. 154(b) by 0 days.

(21) Appl. No.: 16/798,191

(22) Filed: Feb. 21, 2020

(65) Prior Publication Data
US 2020/0196453 A1 Jun. 18, 2020

Related U.S. Application Data

(63) Continuation of application No. PCT/KR2018/009671, filed on Aug. 22, 2018.

(30) Foreign Application Priority Data

Aug. 23, 2017 (KR) .......................... 10-2017-0106694

(51) Int. Cl.
*H05K 1/18* (2006.01)
*H01L 21/48* (2006.01)
(Continued)

(52) U.S. Cl.
CPC .......... *H05K 1/189* (2013.01); *H01L 21/4846* (2013.01); *H01L 23/4985* (2013.01);
(Continued)

(58) Field of Classification Search
CPC ........ H05K 1/189; H05K 1/118; H05K 1/181; H05K 3/341; H05K 3/243; H05K 3/34; H05K 3/244; H05K 1/111; H05K 1/09
(Continued)

(56) References Cited

U.S. PATENT DOCUMENTS 8,766,284 B1 * 7/2014 Dutta ..................... G02B 6/32
257/82
2006/0132545 A1 * 6/2006 Tanikawa ............... B41J 2/1603
347/61
(Continued)

FOREIGN PATENT DOCUMENTS

JP 2005-183720 A 7/2005
JP 2011-233915 A 11/2011
(Continued)

OTHER PUBLICATIONS

International Search Report issued in PCT/KR2018/009671; dated Dec. 3, 2018.
(Continued)

*Primary Examiner* — Sherman Ng
(74) *Attorney, Agent, or Firm* — Studebaker & Brackett PC (57) ABSTRACT

The present invention comprises: a base film on which a first element mounting part and a second element mounting part are defined; wiring patterns formed by extending from each of the first element mounting part and the second element mounting part on the base film, wherein the wiring patterns include a first terminal part in the first element mounting part and a second terminal part in the second element mounting part; and a first plating layer formed on the second terminal part, wherein the first plating layer includes a pure metal plating layer, and the first plating layer is not formed on the first terminal part.

14 Claims, 5 Drawing Sheets

(51) Int. Cl.
  *H01L 23/498* (2006.01)
  *H05K 1/11* (2006.01)
  *H05K 3/24* (2006.01)
  *H05K 3/28* (2006.01)
  *H05K 3/34* (2006.01)

(52) U.S. Cl.
  CPC .. *H01L 23/49838* (2013.01); *H01L 23/49866* (2013.01); *H05K 1/118* (2013.01); *H05K 1/181* (2013.01); *H05K 3/244* (2013.01); *H05K 3/28* (2013.01); *H05K 3/341* (2013.01); *H05K 3/3473* (2013.01); *H05K 2201/0347* (2013.01); *H05K 2201/1003* (2013.01); *H05K 2201/10015* (2013.01); *H05K 2201/10022* (2013.01)

(58) Field of Classification Search
  USPC ........................................................ 361/751
  See application file for complete search history.

(56) References Cited

U.S. PATENT DOCUMENTS

| | | | | |
|---|---|---|---|---|
| 2012/0193139 | A1* | 8/2012 | Okuyama | H05K 3/3426 174/551 |
| 2014/0347822 | A1* | 11/2014 | Mizushiro | H05K 3/3452 361/746 |

FOREIGN PATENT DOCUMENTS

| | | |
|---|---|---|
| JP | 2013-145847 A | 7/2013 |
| JP | 2015-057805 A | 3/2015 |
| KR | 10-2004-0040348 A | 5/2004 |
| KR | 10-2007-0041032 A | 4/2007 |
| KR | 10-2010-0084684 A | 7/2010 |
| KR | 10-2011-0044532 A | 4/2011 |
| KR | 10-2011-0131042 A | 12/2011 |
| KR | 10-2017-0045948 A | 4/2017 |
| TW | 201511622 A | 3/2015 |
| TW | 201714257 A | 4/2017 |
| TW | 201717353 A | 5/2017 |

OTHER PUBLICATIONS

Office Action issued in KR 10-2017-0106694; mailed by the Korean Intellectual Property Office dated Oct. 23, 2019.

Office Action issued in TW 107129226; mailed by the Taiwan Intellectual Property Office dated Jul. 5, 2019.

An Office Action; "Notice of Reasons for Refusal", mailed by the Japanese Patent Office dated Apr. 27, 2021, which corresponds to Japanese Patent Application No. 2020-509509 and is related to U.S. Appl. No. 16/798,191; with English language translation.

An Office Action mailed by the Japanese Patent Office dated Sep. 14, 2021, which corresponds to Japanese Patent Application No. 2020-509509 and is related to U.S. Appl. No. 16/798,191; with English language translation.

\* cited by examiner

FLEXIBLE CIRCUIT BOARD AND METHOD FOR PRODUCING SAME

CROSS-REFERENCE TO RELATED APPLICATIONS

This application is a Continuation of International Application No. PCT/KR2018/009671 filed Aug. 22, 2018, which claims benefit of priority to Korean Patent Application No. 10-2017-0106694 filed Aug. 23, 2017, the entire content of which is incorporated herein by reference.

TECHNICAL FIELD

The present invention relates to a flexible circuit board and a method of fabricating the same, and more particularly, a flexible circuit board including a base film having a passive element mounting part and a semiconductor element mounting part defined thereon.

BACKGROUND ART

As electronic devices have recently become compact in size, chip-on film (COF) packaging using a flexible circuit board has been used. A flexible circuit board and COF packaging using the flexible circuit board are used in a flat panel display (FPD) such as, for example, a liquid crystal display (LCD) or an organic light-emitting diode (OLED) display.

A semiconductor element for providing driving signals to the FPD and passive elements that are connected to the semiconductor element may be mounted on the flexible circuit board. The semiconductor element and the passive elements may be bonded to the flexible circuit board in different manners. Specifically, the passive elements may be mounted on the flexible circuit board via separate bonding means such as solder, and the semiconductor element may be placed in direct contact with, and mounted on, the flexible circuit board via, for example, flip-chip bonding.

DISCLOSURE

Technical Problems

To address the aforementioned problems, the present invention provides a flexible circuit board on which a semiconductor element and a passive element are mounted in different manners.

The present invention also provides a method of fabricating a flexible circuit board on which a semiconductor element and a passive element are mounted in different manners.

Additional advantages, subjects, and features of the present invention will be set forth in part in the description which follows and in part will become apparent to those having ordinary skill in the art upon examination of the following or may be learned from practice of the present invention.

Technical Solutions

According to an aspect of the present invention, a flexible circuit board includes: a base film having first and second element mounting parts defined thereon; wiring patterns formed on the base film to extend into the first and second element mounting parts, the wiring patterns including first terminal parts in the first element mounting part and second terminal parts in the second element mounting part; and a first plating layer formed on the second terminal parts, the first plating layer including a pure metal plating layer, wherein the first plating layer is not formed on the first terminal parts.

The flexible circuit board may further include a second plating layer formed on the first terminal parts, wherein the wiring patterns include copper and the second plating layer includes a copper-metal alloy layer.

The first plating layer may further include a copper-metal alloy layer, which is formed below the pure metal plating layer.

The flexible circuit board may further include a protective layer formed on the wiring patterns, wherein the wiring patterns further include connecting wires, which connect the first terminal parts and the second terminal parts and the protective layer covers the connecting wires.

The flexible circuit board may further include a middle plating layer formed between the protective layer and the connecting wires, wherein the middle plating layer includes a pure metal plating layer or a copper-metal alloy layer.

Boundaries of the protective layer may be spaced apart from bonding terminals of the first terminal parts or bonding terminals of the second terminal parts by as much as 100 μm or greater.

The flexible circuit board may further include: solder formed on the first terminal parts; a first element bonded to the solder; and a second element bonded to the second terminal parts, the second element being flip-chip-bonded to the wiring patterns.

The first element may include a passive element, and the second element may include a semiconductor element.

The pure metal plating layer may include at least one of tin, gold, palladium, nickel, and chromium.

According to another aspect of the present invention, a method of fabricating a flexible circuit board includes: providing a base film having first and second element mounting parts defined thereon; forming wiring patterns on the base film to extend into the first and second element mounting parts, the wiring patterns including first terminal parts in the first element mounting part and second terminal parts in the second element mounting part; forming a first plating layer, which includes a pure metal plating layer, on the second terminal parts; mounting a first element on the first terminal parts via a reflow process; and mounting a semiconductor element on the second terminal parts.

The method may further include forming a second plating layer on the first terminal parts, wherein the second plating layer includes a copper-metal alloy layer.

The forming the first plating layer may include forming the first plating layer even on parts of the wiring patterns, other than the first terminal parts and the second terminal parts.

The mounting the first element may include performing thermal treatment locally on the first element mounting part.

The performing thermal treatment locally on the first element mounting part may include performing thermal treatment using one of hot wind, laser, light, and a hotplate.

The method may further include forming a protective layer on the wiring patterns after the forming the first plating layer.

The forming the first plating layer may include forming the first plating layer after the forming the protective layer the wiring patterns.

The forming the first plating layer on the second terminal parts may include forming the first plating layer on a copper-metal alloy layer that covers the second terminal parts.

Other specific details of the present invention are included in the detailed description and drawings.

Advantageous Effects

According to exemplary embodiments of the present invention, a flexible circuit board includes, different mounting areas for bonding a semiconductor element and a passive element on a base film. Thus, bonding of the semiconductor element and the passive element to be mounted on the flexible circuit board can be secured.

Effects of the present invention are not limited to those described above, and other effects of the present invention that are not mentioned herein will be apparent to those skilled in the art from the claims.

BEST MODES FOR CARRYING OUT THE PRESENT INVENTION

Advantages and features of the present invention, and a method of accomplishing the same will be apparent with reference to the embodiments described below in detail with reference to the accompanying drawings. However, the present invention is not limited to the embodiments disclosed below, but may be implemented in various forms. It is provided to fully convey the scope of the present invention to those skilled in the art, and the present invention is defined only by the scope of the claims. The size and relative size of the components shown in the drawings may be exaggerated for clarity of explanation. Like reference numerals refer to like elements throughout the specification, and the term "and/or", as used herein, encompasses each and every combination of one or more of the mentioned items.

Cases where elements or layers are referred to as being located "on" other elements or layers include all the cases where other layers or other elements are interposed directly on or between other elements. Meanwhile, cases where the elements are "directly on" indicate that no other element or layer is interposed therebetween.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Flexible circuit boards according to embodiments of the present invention will hereinafter be described with reference to FIGS. 1 through 10.

Figure 1:
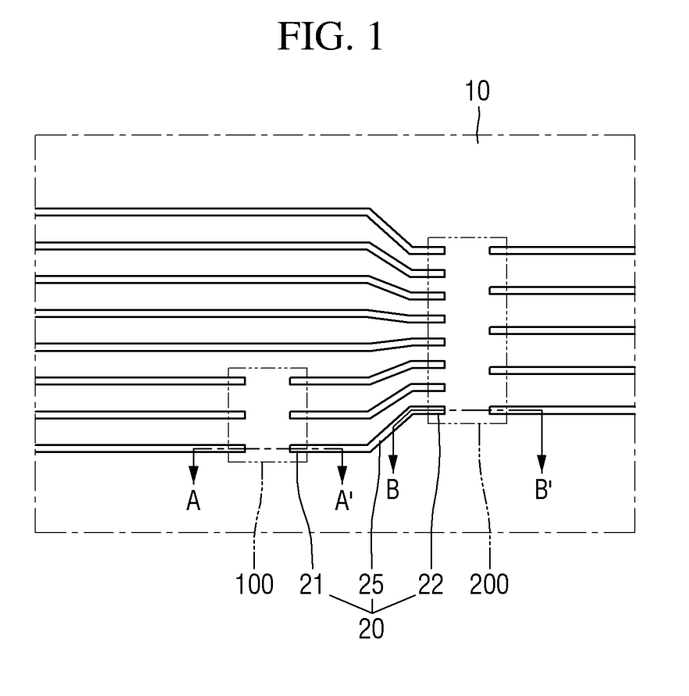
FIG. 1 is a top view of a flexible circuit board according to some embodiments of the present invention.
Figure 2:
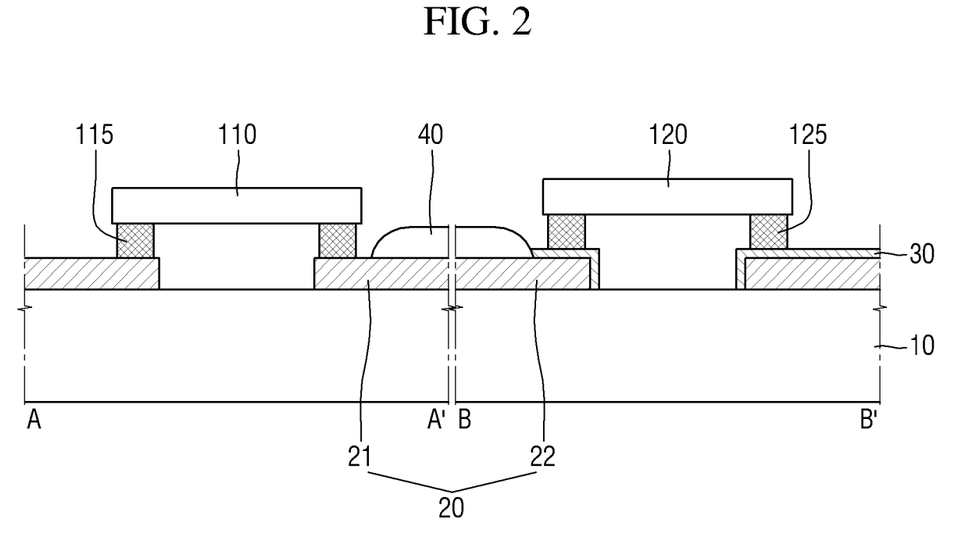
FIG. 2 is a cross-sectional view, taken along lines A-A' and B-B' of FIG. 1, of the flexible circuit board according to some embodiments of the present invention.

FIG. 1 is a top view of a flexible circuit board according to some embodiments of the present invention, and FIG. 2 is a cross-sectional view of the flexible circuit board according to some embodiments of the present invention, taken along lines A-A' and B-B' of FIG. 1.

Referring to FIGS. 1 and 2, the flexible circuit board may include a base film 10, wiring patterns 20, a first plating layer 30, and a protective layer 40.

The base film 10 may be formed of a material with flexibility, and may be included in the flexible circuit board as a base so that the flexible circuit board can be made bendable or foldable. The base film 10 may be, for example, a polyimide film. Alternatively, the base film 10 may be an insulating film such as a polyethylene terephthalate (PET) film, a polyethylene naphthalate film, or a polycarbonate film or a metal foil such as an aluminum oxide foil. The baes film 10 will hereinafter be described as being a polyimide film.

The base film 10 may have a passive element mounting part 100 and a semiconductor element mounting part 200 defined thereon. The passive element mounting part 100 may be a region in which a passive element 110 is to be mounted on the flexible circuit board, and the semiconductor element mounting part 200 may be a region in which a semiconductor element 120 is to be mounted on the flexible circuit board.

Specifically, an element such as, for example, a resistor, a capacitor, or an inductor, may be mounted on the passive element mounting part 100, and an element such as, for example, a display driver IC (DDI), may be mounted on the semiconductor element mounting part 200. That is, the a DDI may be mounted on the semiconductor element mounting part 200, and passive elements that are coupled to the DDI may be mounted on the passive element mounting part 100.

FIG. 1 illustrates that one passive element mounting part 100 and one semiconductor element mounting part 200 are defined on the base film 10, but the present invention is not limited thereto. The numbers of passive element mounting parts 100 and semiconductor element mounting parts 200 defined on the base film 10 may vary depending on the circuitry configuration of the flexible circuit board.

The passive element mounting part 100 may be a region where a passive element mounted on the base film 10 and the base film 10 vertically overlap. Similarly, the semiconductor element mounting part 200 may be a region where a semiconductor element mounted on the base film 20 and the base film 10 vertically overlap.

The wiring patterns 20 may be formed on the base film 10. The wiring patterns 20 may include one or more conductive wires that are formed in the base film 10 to extend into the passive element mounting part 100 and the semiconductor element mounting part 200. The wiring patterns 20 may connect the passive element mounting part 100 and the semiconductor element mounting part 200. Thus, electrical signals may be transmitted between the semiconductor element mounting part 200 and the passive element mounting part 100 via the wiring patterns 20.

The wiring patterns 20 may include, for example, a conductive material such as copper, but the present invention is not limited thereto. Specifically, the wiring patterns 20 may include a material with electrical conductivity such as gold, aluminum, or the like. The wiring patterns 20 will hereinafter be described as including copper.

A plurality of conductive wires included in the wiring patterns 20 may be disposed to be spaced apart from one another in the lengthwise direction of the passive element mounting part 100 (i.e., a vertical direction in the example of FIG. 1) and to extend in the widthwise direction of the passive element mounting part 100 (i.e., a horizontal direction in the example of FIG. 1), but the present invention is not limited thereto. Alternatively, the plurality of conductive wires may extend in a direction other than the widthwise direction of the passive element mounting part 100 (i.e., the horizontal direction in the example of FIG. 1).

FIG. 1 illustrates that there are 6 wiring patterns 20 on either side of the passive element mounting part 100 and there are 13 wiring patterns 20 on either side of the semiconductor element mounting part 200, but the present invention is not limited thereto. Obviously, the number of wiring patterns 20 may vary depending on the designs of the flexible circuit board and elements connected to the flexible circuit board.

FIG. 1 illustrates that the wiring patterns 20 are disposed on both sides of the passive element mounting part 100, but the present invention is not limited thereto. Alternatively, the wiring patterns 20 may be disposed on only one side of the passive element mounting part 100.

The wiring patterns 20 may include first terminal parts 21, which extend into the passive element mounting part 100, and second terminal parts 22, which extend into the semiconductor element mounting part 200. The first terminal parts 21 and the second terminal parts 22 may be connected by connecting wires 25.

The first terminal parts 21 may overlap with the passive element mounting part 100 on the base film 10, and the second terminal parts 22 may overlap with the semiconductor element mounting part 200 on the base film 10. The connecting wires 25 may not overlap with the passive element mounting part 100 or the semiconductor element mounting part 200 on the base film 10.

The passive element 110, which is mounted on the flexible circuit board, may be electrically connected to the wiring patterns 20. Specifically, the passive element 110 may be electrically connected to the first terminal parts 21.

Similarly, the semiconductor element 120, which is mounted on the flexible circuit board, may be electrically connected to the wiring patterns 21. Specifically, the semiconductor element 120 may be electrically connected to the second terminal parts 22.

The first plating layer 30 may be formed on the wiring patterns 20. Specifically, the first plating layer 30 may be formed on the wiring patterns 20 in the semiconductor element mounting part 200. Thus, the first plating layer 30 may be formed not on the first terminal parts 21, but to cover only the second parts 22.

In some embodiments, the first plating layer 30 may include a pure metal plating layer. Specifically, the first plating layer 30 may be a pure tin plating layer. The term "pure metal plating layer", as used herein, means that the first plating layer 30 does not have the metallic component (s) of the wiring patterns 20 diffused into. For example, in a case where the wiring patterns 20 include copper, the first plating layer 30 may not include a copper-metal alloy layer.

However, the present invention is not limited to this, and alternatively, the first plating layer 30 may include a copper-metal plating layer with some copper diffused in a pure metal plating layer. That is, the first plating layer 30 may have a structure in which a copper-metal layer is formed below a pure metal plating layer.

The first plating layer 30 has been described as being, for example, a pure tin plating layer, but the present invention is not limited thereto. The first plating layer 30 may be formed using an alloy of one or more metallic materials such as gold, palladium, nickel, chromium, and the like through surface treatment performed on the wiring patterns 20. The first plating layer 30 will hereinafter be described as being a pure tin plating layer.

As illustrated in FIG. 2, in some embodiments, the first plating layer 30 may not be formed in the passive element mounting part 100 because the manner in which the passive element 110 is bonded to the first terminal parts 21 differs from the manner in which the semiconductor element 120 is bonded to the second terminal parts 22. Specifically, the passive element 110 may be bonded to the first terminal parts 21 via solder 115, and the semiconductor element 120 may be bonded to the first plating layer 30 on the second terminal parts 22 via bumps 125.

The passive element 110 may be bonded to the first terminal parts 21 by disposing the solder 115 between the terminal of the passive element 110 and the first terminal parts 21 and performing reflow treatment on the passive element mounting part 100. The performing of reflow treatment may include providing a source of heat such as hot wind, laser, and light to a limited area on the passive element mounting part 100 to heat the solder 115 or using a hotplate.

On the contrary, the semiconductor element 120 may be bonded to the second terminal parts 22 by placing the terminal of the semiconductor element 120 and the bumps 125 in contact with the first plating layer 30 and heating the contact areas of the terminal of the semiconductor element 120/the bumps 125 and the first plating layer 30 to mount the semiconductor element 120 on the second terminal parts 22. The heating of the bumps 125 may include performing thermal treatment on the flexible circuit board via a reflow process or using a thermocompression process.

As described above, since the second terminal parts 22 are bonded to the semiconductor element 120 via the first plating layer 30, the bonding between the semiconductor element 120 and the second terminal parts 22 can be improved. Also, as described above, since the first plating layer 30 includes, for example, a pure tin plating layer, the bonding between the bumps 125 of the semiconductor element 120 and the first plating layer 30 can be improved.

Since the semiconductor element 120 is mounted on the flexible circuit board via the first plating layer 30, which is formed on the second terminal parts 22, for the purpose of improving the connection to the semiconductor element 120, which are bonded via the bumps 125, the probability of any connection or bonding defect in the semiconductor element 120 when mounting the semiconductor element 120 on the flexible circuit board can be reduced. Thus, the operation reliability of the flexible circuit board can be improved.

The protective layer 40 may be formed on the wiring patterns 20. The protective layer 40 may be, for example, formed in areas other than on parts of the wiring patterns 20 that are exposed for bonding the passive element 110 and the semiconductor element 120. Specifically, the protective layer 40 may be formed on the connecting wires 25 and may also be formed on parts of the first terminal parts 21 and parts of the second terminal parts 22, as illustrated in FIG. 2.

The protective layer 40 may include, for example, a flexible non-conductor material such as solder resist or a coverlay film.

In the flexible circuit board of FIG. 2, the protective layer 40 may be formed directly on the wiring patterns 20. Here, the expression "the protective layer 40 being formed directly on the wiring patterns" means that there are no intervening elements between the protective layer 40 and the wiring patterns 20, particularly, no plating layer between the protective layer 40 and the wiring patterns 20.

In some embodiments, the protective layer 40 may preferably be spaced apart from the connection terminals of the first terminal parts 21 where the passive element 110 is mounted, by as much as 100 μm or greater. That is, the protective layer 40 may be spaced apart from the solder 115, which bonds the passive element 110 and the first terminal parts 21, by as much as 100 μm or greater.

Also, the protective layer 40 may preferably be spaced apart from the contact surfaces of the second terminal parts 22 where the semiconductor element 120 is mounted, by as much as 100 μm or greater. That is, the protective layer 40 may be spaced apart from the bumps 125, which bonds the semiconductor element 120 and the second terminal parts 22, by as much as 100 μm or greater.

The protective layer 40 may be spaced by as much as the aforementioned distance from the first terminal parts 21 or the second terminal parts 22 in order to prevent the protective layer 40 from being formed even in bonding parts due to a bleed phenomenon, which is the spread of a liquid material from the edges of the protective layer 40, in a case where the protective layer 40 is formed of the liquid material. Thus, the distance between the protective layer 40 and the first terminal parts 21/the second terminal parts 22 may vary depending on the physical property of the edges of the protective layer 40, and in an embodiment where solder resist is used as the protective layer 40, the protective layer 40 may preferably be spaced apart from the first terminal parts 21/the second terminal parts 22 by as much as 100 μm or greater.

In some embodiments, a semiconductor element may be mounted on the passive element mounting part 100, and a passive element may be mounted on the semiconductor element mounting part 200. That is, it is sufficient that different types of elements are mounted on the passive element mounting part 100 and the semiconductor element mounting part 200.

Accordingly, alternatively to what has been described above, the first plating layer 30 may be formed not on the bonding parts of wiring patterns where a semiconductor element is mounted, but on the bonding parts of wiring patterns where a passive element is mounted.

Figure 3:
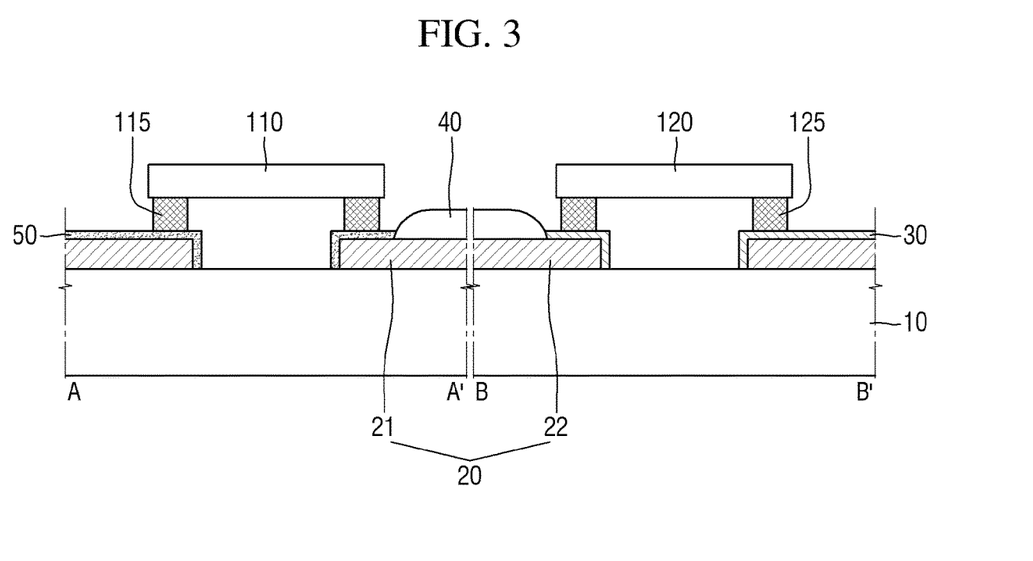
FIG. 3 is a cross-sectional view, taken along lines A-A' and B-B' of FIG. 1, of a flexible circuit board according to other embodiments of the present invention.

FIG. 3 is a cross-sectional view, taken along lines A-A' and B-B' of FIG. 1, of a flexible circuit board according to other embodiments of the present invention.

Referring to FIG. 3, a flexible circuit board may further include a second plating layer 50 on first terminal parts 21.

As illustrated in FIG. 3, the second plating layer 50 may be formed only on the first terminal parts 21, but not on second terminal parts 22. The second plating layer 50 may include, for example, a copper-tin alloy layer.

That is, in the flexible circuit board of FIG. 3, a copper-tin alloy layer may be formed on the first terminal parts 21, but a first plating layer 30, which is a pure tin plating layer, rather than a copper-tin alloy layer, may be formed on second terminal parts 22.

A pure tin plating layer may be formed by plating the surfaces of the first terminal parts 21. Then, the second plating layer 50, which is a copper-tin alloy layer, may be formed due to a copper-tin diffusion reaction caused by heat provided to the pure tin plating layer during a reflow process for mounting a passive element 110 on a passive element mounting part 100.

In some embodiments, the first plating layer 30 may be a plating layer that has not been influenced by heat from the reflow process for bonding the passive element 110. That is, since the reflow process for bonding the passive element 110 is performed only locally on the passive element mounting part 100, the first plating layer 30 may remain as it is as a pure tin plating layer without being deformed into a copper-tin alloy layer.

Figure 4:
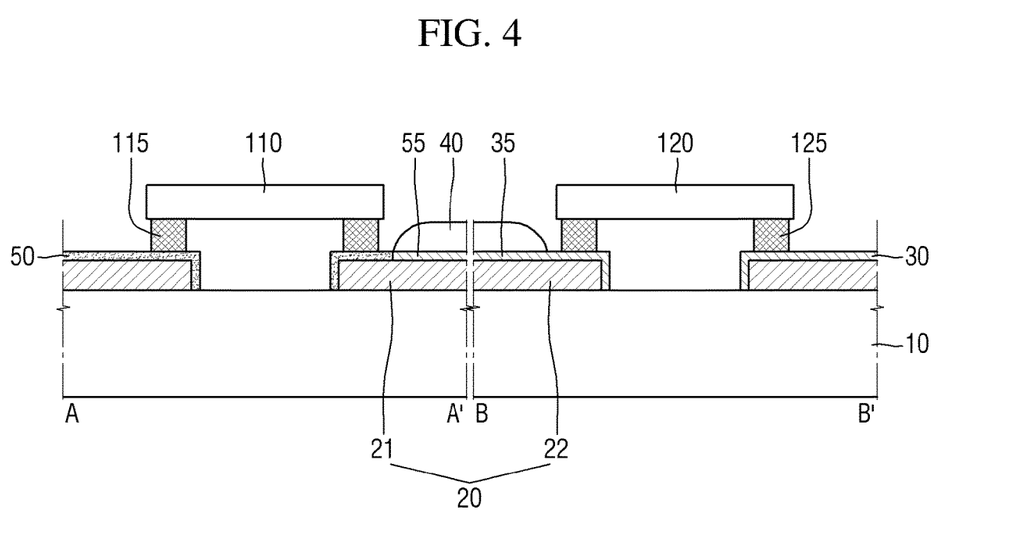
FIG. 4 is a cross-sectional view, taken along lines A-A' and B-B' of FIG. 1, of a flexible circuit board according to other embodiments of the present invention.

FIG. 4 is a cross-sectional view, taken along lines A-A' and B-B' of FIG. 1, of a flexible circuit board according to other embodiments of the present invention.

Referring to FIG. 4, the flexible circuit board may include middle plating layers (35 and 55), which are formed between a protective layer 40 and wiring patterns 20.

In some embodiments, a first middle plating layer 35 may be formed on first terminal parts 21 in a passive element mounting part 100. The first middle plating layer 35 may be interposed between the protective layer 40 and the first terminal parts 21. Thus, the first middle plating layer 35 and the protective layer 40, or the first middle plating layer 35 and the first terminal parts 21, may vertically overlap.

Also, in some embodiments, a second middle plating layer 55 may be formed on second terminal parts 22 in a semiconductor element mounting part 200. The second middle plating layer 55 may be interposed between the protective layer 40 and the second terminal parts 22. Thus, the second middle plating layer 55 and the protective layer 40, or the second middle plating layer 55 and the second terminal parts 22, may vertically overlap.

In some embodiments, the first middle plating layer 35 and a first plating layer 30 may include substantially the same composition. Specifically, the first middle plating layer 35 and the first plating layer 30 may include pure tin plating layers.

On the contrary, the second middle plating layer 55 and a second plating layer 50 may include different compositions. Specifically, the second middle plating layer 55 may include a pure tin plating layer, but the second plating layer 50 may include a copper-tin alloy layer.

The first and second middle plating layers 35 and 55 may include pure tin plating layers because the first and second middle plating layers 35 and 55 are blocked by the protective layer 40 from heat generated during a reflow process for mounting a passive element 110 on the passive element mounting part 100. Thus, the first and second middle plating layers 35 and 55 may include pure tin plating layers not having copper diffused thereinto by heat.

Also, in order for the first and second middle plating layers 35 and 55 to include pure tin plating layers, the first and second plating layers 30 and 50 and the first and second middle plating layers 35 and 55 may be formed on the wiring patterns 20, the protective layer 40 may be formed on the first and second middle plating layers 35 and 55, and a reflow process may be performed on the second plating layer 50 to bond the passive element 110.

Figure 5:
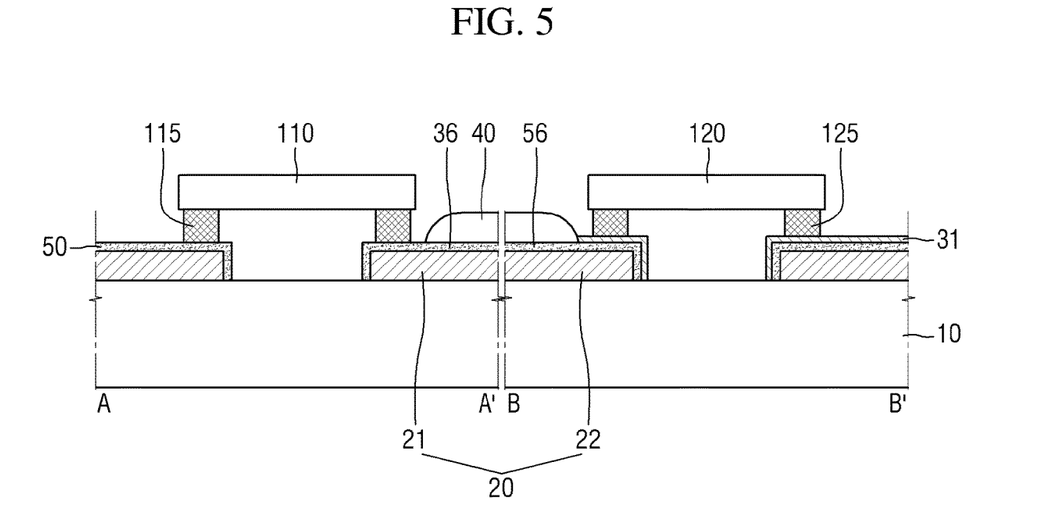
FIG. 5 is a cross-sectional view, taken along lines A-A' and B-B' of FIG. 1, of a flexible circuit board according to other embodiments of the present invention.

FIG. 5 is a cross-sectional view, taken along lines A-A' and B-B' of FIG. 1, of a flexible circuit board according to other embodiments of the present invention.

Referring to FIG. 5, the flexible circuit board may include a third middle plating layer 36, a fourth middle plating layer 56, and a first plating layer 31, which is formed on the fourth middle plating layer 56.

The third middle plating layer 36 may include substantially the same material as a second plating layer 50. Specifically, the third middle plating layer 36 and the second plating layer 50 may include copper-tin alloy layers.

The third middle plating layer 36 may be formed on first terminal parts 21 in a passive element mounting part 100. The third middle plating layer 36 may be interposed between the protective layer 40 and the first terminal parts 21. Thus, the third middle plating layer 36 and the protective layer 40, or the third middle plating layer 36 and the first terminal parts 21, may vertically overlap.

The fourth middle plating layer 56 may include substantially the same material as the third middle plating layer 36. Specifically, the fourth middle plating layer 56 may include a copper-tin alloy layer.

The first plating layer 31 may be formed on the fourth middle plating layer 56. That is, the fourth middle plating layer 56 may be interposed between the first plating layer 31 and second terminal parts 22. The first plating layer 31 may include a pure tin plating layer.

The third and fourth middle plating layers 36 and 56, which include copper-tin alloy layers, are interposed between the protective layer 40/the first plating layer 31 and wiring patterns 20 because after the formation of a pure tin plating layer on the wiring patterns 20, the second plating layer 50, the third middle plating layer 36, and the fourth middle plating 56 are formed by a reflow process, which is for bonding a passive element 110, and the first plating layer 31, which is a pure tin plating layer, is formed on the fourth middle plating layer 56.

Even though the fourth middle plating layer 56 is formed, a semiconductor element 120 is bonded via the first plating layer 31, which is a pure tin plating layer, and via bumps 125. Thus, bonding of the semiconductor element 120 can be properly maintained.

Figure 6:
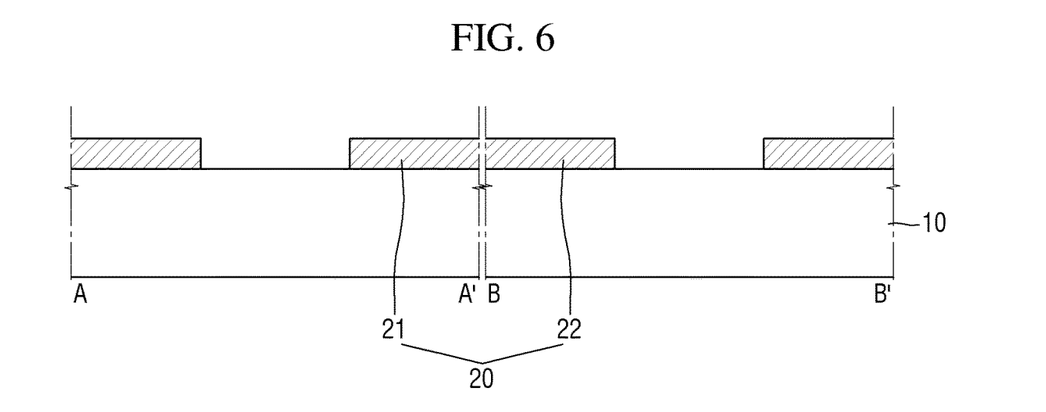
FIGS. 6 through 8 are views illustrating intermediate steps of a method of fabricating a flexible circuit board according to some embodiments of the present invention.
Figure 7:
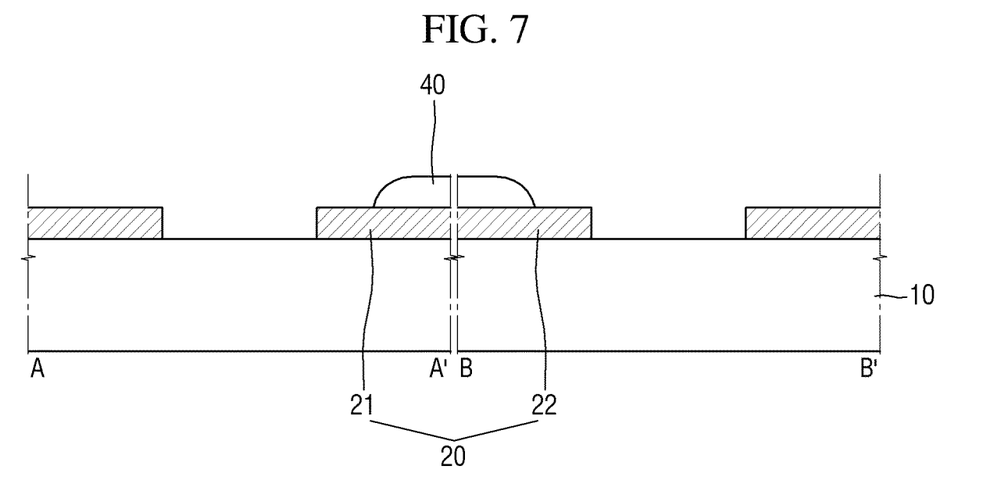
Figure 8:
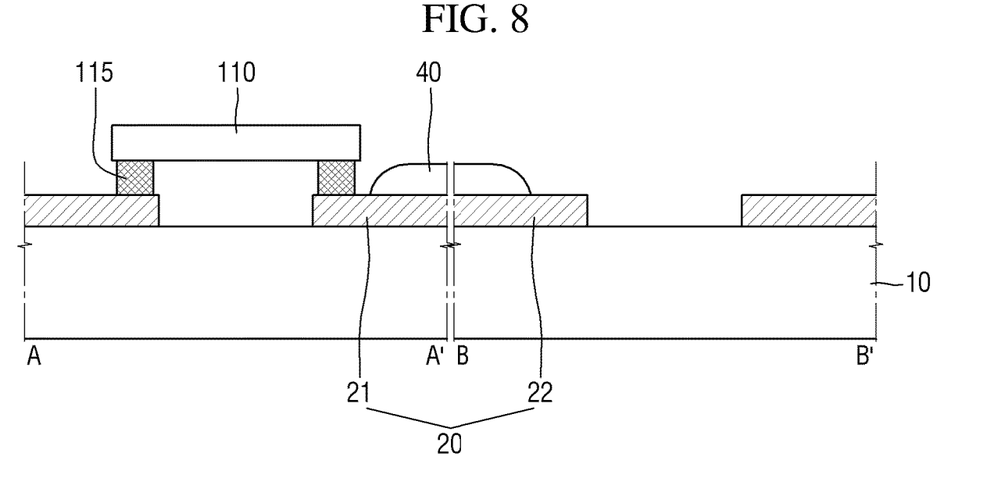

FIGS. 6 through 8 are views illustrating intermediate steps of a method of fabricating a flexible circuit board according to some embodiments of the present invention. FIGS. 6 through 8, like FIGS. 2 through 5, are cross-sectional views taken along lines A-A' and B-B' of FIG. 1.

Referring to FIG. 6, wiring patterns 20 are formed on a base film 10. The wiring patterns 20 may be formed by a photoetching method, which involves forming a thin metal film on one surface of the base film 10 and etching and patterning the thin metal film, by a semi-additive method, which involves forming resist patterns on the base film 10 with an underlayer formed thereon and electroplating a conductive material between the resist patterns, and removing the resist patterns and the underlayer, or by printing a conductive paste to print the wiring patterns 20.

The wiring patterns 20, which are formed on the base film 10, may connect a passive element mounting part 100 and a semiconductor element mounting part 200.

Referring to FIG. 7, a protective layer 40 is formed on the base film 10. The protective layer 40 may be formed by a printing method or a coating method using a liquid material such as a liquid material or by a lamination method using a coverlay film.

The protective layer 40 may be formed to cover areas other than first terminal parts 21 and second terminal parts 22.

Referring to FIG. 8, a passive element 110 is mounted on a passive element mounting part 100. Specifically, the passive element 110 may be mounted by disposing solder 115 on the first terminal parts 21 in the passive element mounting part 100 and bonding the passive element 110 to the first terminal parts 21 via a reflow process.

Thereafter, referring again to FIG. 2, a first plating layer 30 is formed on the semiconductor element mounting part 200, and a semiconductor element 120 is bonded to the first plating layer 30 via bumps 125.

The first plating layer 30 may be formed by, for example, electroplating or electroless plating using tin.

Figure 9:
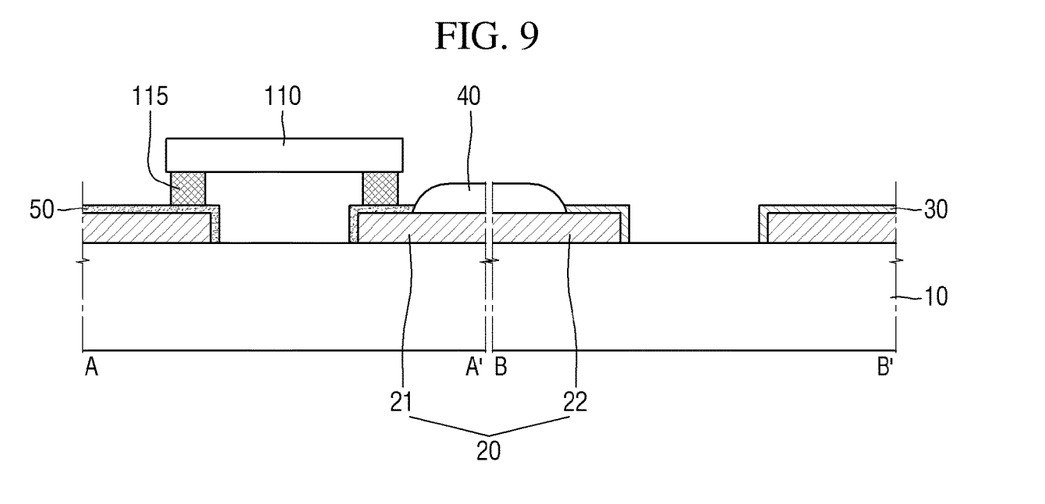
FIG. 9 is a view illustrating intermediate steps of the method of fabricating a flexible circuit board according to some embodiments of the present invention.

FIG. 9 is a view illustrating intermediate steps of the method of fabricating a flexible circuit board according to some embodiments of the present invention. Specifically, FIG. 9 illustrates a method of fabricating the flexible circuit board according to the embodiment of FIG. 3, particularly, steps that follow the steps illustrated in FIG. 7.

Referring to FIG. 9, a protective layer 40 is formed on wiring patterns 20, and a pure tin plating layer is formed on a passive element mounting part 100 and a semiconductor element mounting part 200. A passive element 110 is mounted on the pure tin plating layer using solder 115 and is then bonded by a reflow process. As a result of the reflow process, the pure tin plating layer may be transformed into a second plating layer 50 including a copper-tin alloy layer.

Thereafter, referring again to FIG. 3, a semiconductor layer 120 is bonded to the first plating layer 30 over the semiconductor element mounting part 200 via bumps 125.

Figure 10:
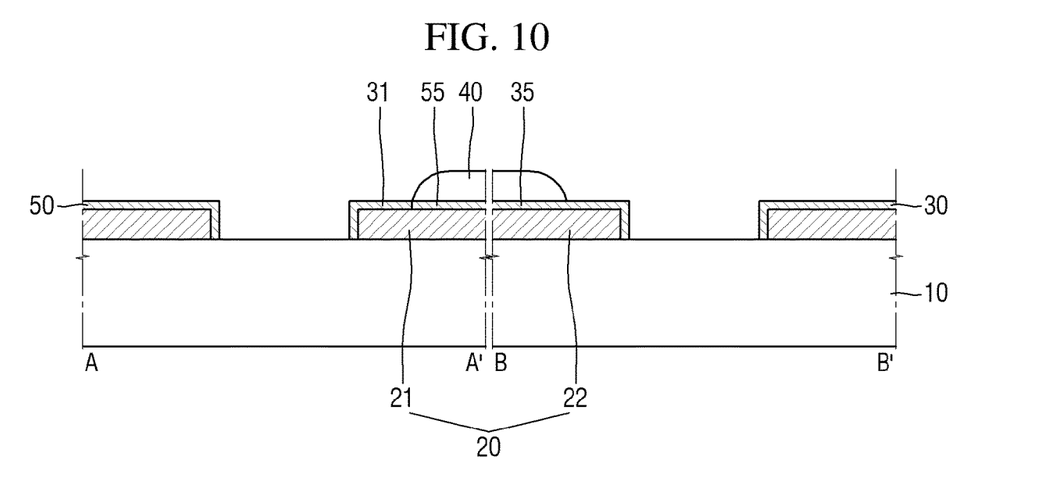
FIG. 10 is a view illustrating intermediate steps of the method of fabricating a flexible circuit board according to some embodiments of the present invention.

FIG. 10 is a view illustrating intermediate steps of the method of fabricating a flexible circuit board according to some embodiments of the present invention. Specifically, FIG. 10 illustrates a method of fabricating the flexible circuit board according to the embodiment of FIG. 4, particularly, steps that follow the steps illustrated in FIG. 6.

Referring to FIG. 10, a plating layer 150 is formed to cover wiring patterns 20, and a protective layer 40 is formed on the plating layer 150. The plating layer 150 may be formed to cover all wiring patterns 20 including first terminal parts 21, second terminal parts 22, and connecting wires 25. The plating layer 150 may be formed by, for example, forming a tin plating layer through plating or electroless plating.

The protective layer 40 may be formed to cover the connecting wires 25 and may be formed to cover parts of the first terminal parts 21 and parts of the second terminal parts 22, as illustrated in FIG. 10.

Thereafter, referring again to FIG. 4, a passive element 110 is bonded onto the first terminal parts 21 via solder 115, and a semiconductor element 120 is bonded onto the second terminal parts 22 via bumps 125.

As a result of a reflow process for bonding the passive element 110, the plating layer 150 on the first terminal parts 21 may be transformed into a copper-tin alloy layer, thereby forming a second plating layer 50. However, since the reflow process is thermal treatment performed locally on the passive element mounting part 100, the plating layer on the semiconductor element mounting part 200 may include a pure tin plating layer. First and second middle plating layers 35 and 55, which overlap with the protective layer 40, may also include pure tin plating layers.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The present invention is defined by the following claims, with equivalents of the claims to be included therein.

DESCRIPTION OF REFERENCE NUMERALS

| | |
|---|---|
| 10: Base Film | 20: Wiring Patterns |
| 21, 22: Terminal Parts | 25: Connecting Wires |
| 30, 31: First Plating Layers | 35, 55; Middle Plating Layers |
| 40: Protective Layer | 50: Second Plating Layer |
| 100: Passive Element Mounting Part | 110: Passive Element |
| 120: Semiconductor Element | 200: Semiconductor Element Mounting Part |

What is claimed is:

1. A flexible circuit board comprising:
a base film having first and second element mounting parts defined thereon;
wiring patterns formed on the base film to extend into the first and second element mounting parts, the wiring patterns including first terminal parts in the first element mounting part and second terminal parts in the second element mounting part;
a first plating layer formed on the second terminal parts, the first plating layer including a pure metal plating layer,
wherein the first plating layer is not formed on the first terminal parts;
a protective layer formed on the wiring patterns,
wherein
the wiring patterns further include connecting wires, which connect the first terminal parts and the second terminal parts, and
the protective layer covers the connecting wires; and
a middle plating layer formed between the protective layer and the connecting wires,
wherein the middle plating layer includes a pure metal plating layer or a copper-metal alloy layer.

2. The flexible circuit board of claim 1, further comprising:
a second plating layer formed on the first terminal parts, wherein
the wiring patterns include copper, and
the second plating layer includes a copper-metal alloy layer.

3. The flexible circuit board of claim 1, wherein the first plating layer further includes a copper-metal alloy layer, which is formed below the pure metal plating layer.

4. The flexible circuit board of claim 1, wherein boundaries of the protective layer are spaced apart from bonding terminals of the first terminal parts or bonding terminals of the second terminal parts by as much as 100 μm or greater.

5. The flexible circuit board of claim 1, further comprising:
solder formed on the first terminal parts;
a first element bonded to the solder; and
a second element bonded to the second terminal parts, the second element being flip-chip-bonded to the wiring patterns.

6. The flexible circuit board of claim 5, wherein
the first element includes a passive element, and
the second element includes a semiconductor element.

7. The flexible circuit board of claim 1, wherein the pure metal plating layer includes at least one of tin, gold, palladium, nickel, and chromium.

8. A method of fabricating a flexible circuit board, comprising:
providing a base film having first and second element mounting parts defined thereon;
forming wiring patterns on the base film to extend into the first and second element mounting parts, the wiring patterns including first terminal parts in the first element mounting part and second terminal parts in the second element mounting part;
forming a first plating layer, which includes a pure metal plating layer, on the second terminal parts;
mounting a first element, which is bonded onto the first terminal parts via solder, by performing a reflow process;
mounting a semiconductor element on the second terminal parts,
wherein the first plating layer is not formed on the first terminal parts; and
forming a protective layer on the wiring patterns after the forming the first plating layer.

9. The method of claim 8, further comprising:
forming a second plating layer on the first terminal parts, wherein the second plating layer includes a copper-metal alloy layer.

10. The method of claim 9, wherein the forming the first plating layer, comprises forming the first plating layer even on parts of the wiring patterns, other than the first terminal parts and the second terminal parts.

11. The method of claim 8, wherein the mounting the first element by performing the reflow process, comprises performing thermal treatment locally on the first element mounting part.

12. The method of claim 11, wherein the performing thermal treatment locally on the first element mounting part, comprises performing thermal treatment using one of hot wind, laser, light, and a hotplate.

13. The method of claim 8, wherein the forming the first plating layer, comprises forming the first plating layer after the forming the protective layer on the wiring patterns.

14. The method of claim 8, wherein the forming the first plating layer on the second terminal parts, comprises forming the first plating layer on a copper-metal alloy layer that covers the second terminal parts.

* * * * *